US012733368B2

(12) United States Patent
Hsu

(10) Patent No.: US 12,733,368 B2

(45) Date of Patent: Sep. 8, 2026

(54) DISPLAY DEVICE AND METHOD OF MANUFACTURING THE SAME

(71) Applicant: TAIZHOU GUANYU TECHNOLOGY CO., LTD., Zhejiang Province (CN)

(72) Inventor: Kuo-Cheng Hsu, Taichung City (TW)

(73) Assignee: TAIZHOU GUANYU TECHNOLOGY CO., LTD., Zhejiang Province (CN)

( * ) Notice: Subject to any disclaimer, the term of this patent is extended or adjusted under 35 U.S.C. 154(b) by 423 days.

(21) Appl. No.: 18/488,032

(22) Filed: Oct. 17, 2023

(65) Prior Publication Data

US 2024/0260368 A1 Aug. 1, 2024

(30) Foreign Application Priority Data

Feb. 1, 2023 (CN) ........................ 202310102278.9

(51) Int. Cl.

*H10K 59/35* (2023.01)
*H10K 59/12* (2023.01)
*H10K 59/121* (2023.01)
*H10K 59/122* (2023.01)
*H10K 59/38* (2023.01)

(52) U.S. Cl.

CPC ....... *H10K 59/352* (2023.02); *H10K 59/1201* (2023.02); *H10K 59/121* (2023.02); *H10K 59/122* (2023.02); *H10K 59/38* (2023.02)

(58) Field of Classification Search

CPC ........................... H10K 59/352; H10K 59/121
USPC .................................................. 313/498–512
See application file for complete search history.

(56) References Cited

U.S. PATENT DOCUMENTS

2013/0002118 A1* 1/2013 Ko ......................... H05B 33/02 313/1
2015/0162391 A1* 6/2015 Kim ..................... H10K 59/122 257/40
2016/0343284 A1* 11/2016 Sun ...................... G09G 3/3225
(Continued)

FOREIGN PATENT DOCUMENTS

CN 113314578 A 8/2021
CN 114512521 A 5/2022
(Continued)

OTHER PUBLICATIONS

Notice of Reasons for Rejection dated Dec. 10, 2024 issued by Japan Patent Office for the JP counterpart applications No. 2024-012341.

(Continued)

*Primary Examiner* — Christopher M Raabe

(74) *Attorney, Agent, or Firm* — WPAT LAW; Anthony King

(57) ABSTRACT

A display device and a method of manufacturing the display device are provided. The display device includes a first pixel and a second pixel. The first pixel is adapted to emit light of a first color. The second pixel is adapted to emit light of a second color different from the first color. The profile of the first pixel and the profile of the second pixel meet one of the criteria as follows: (1) the ratio of the length of a long axis to the length of a short axis is greater than or equal to 1 but less than 1.25; and (2) the ratio of the length of the longest side to the length of the shortest side is greater than or equal to 1 but less than 1.25.

20 Claims, 10 Drawing Sheets

(56) References Cited

U.S. PATENT DOCUMENTS

| | | | | |
|---|---|---|---|---|
| 2019/0245017 | A1 | 8/2019 | Jeon et al. | |
| 2020/0357861 | A1* | 11/2020 | Wang | H10K 59/353 |
| 2020/0411602 | A1 | 12/2020 | Zhao et al. | |
| 2021/0359030 | A1 | 11/2021 | Qiu et al. | |
| 2021/0384268 | A1 | 12/2021 | Liu et al. | |
| 2022/0140288 | A1 | 5/2022 | Ji et al. | |
| 2022/0310712 | A1 | 9/2022 | Zhao et al. | |
| 2023/0132240 | A1* | 4/2023 | Choi | H10K 59/8792<br>345/174 |

FOREIGN PATENT DOCUMENTS

| | | | |
|---|---|---|---|
| CN | 115249735 | A | 10/2022 |
| CN | 115377146 | A | 11/2022 |
| TW | I585968 | B | 6/2017 |
| WO | 2019134447 | A1 | 7/2019 |

OTHER PUBLICATIONS

Search report from the European Patent Office of EP patent application 24153298.5 dated Jun. 21, 2024.
English Abstract Translation of Foreign Reference TW I585968.
English Abstract Translation of Foreign Reference CN115377146A.
English Abstract Translation of Foreign Reference CN114512521A.
English Abstract Translation of Foreign Reference CN113314578A.
English Abstract Translation of Foreign Reference CN115249735A.
Notice of Reasons for Rejection dated Jun. 24, 2025 issued by Japan Patent Office for the JP counterpart applications No. 2024-012341.

* cited by examiner

DISPLAY DEVICE AND METHOD OF MANUFACTURING THE SAME

CROSS REFERENCE TO RELATED APPLICATIONS

This application claims the benefit of CN Application No. 202310102278.9, filed on Feb. 1, 2023, the disclosure of which is hereby incorporated by reference in its entirety.

BACKGROUND OF THE PRESENT DISCLOSURE

Field of the Present Disclosure

The present disclosure relates to display devices and, more particularly, to a display device comprising pixels each having a specific profile.

Description of the Prior Art

Display devices each including optical component layers are widely applied to most electronic apparatuses. In recent years, there is demand to upsize the display devices. However, conventional methods of manufacturing the display devices are disadvantaged by a step in which light output efficiency is poor. In fact, one of the well-known challenges to persons skilled in the art is the enhancement of the light output efficiency of the display devices. In view of this, display device manufacturers are looking for a solution to the aforesaid problem.

SUMMARY OF THE PRESENT DISCLOSURE

A display device comprises a first pixel and a second pixel. The first pixel is adapted to emit light of a first color. The second pixel is adapted to emit light of a second color different from the first color. The profile of the first pixel and the profile of the second pixel meet one of the criteria as follows: (1) the ratio of the length of a long axis to the length of a short axis is greater than or equal to 1 but less than 1.25; and (2) the ratio of the length of a longest side to the length of a shortest side is greater than or equal to 1 but less than 1.25.

A method of manufacturing a display device comprises forming a first pixel and forming a second pixel. The first pixel is adapted to emit light of a first color. The second pixel is adapted to emit light of a second color different from the first color. The profile of the first pixel and the profile of the second pixel meet one of the criteria as follows: (1) the ratio of the length of a long axis to the length of a short axis is greater than or equal to 1 but less than 1.25; and (2) the ratio of the length of a longest side to the length of a shortest side is greater than or equal to 1 but less than 1.25.

DETAILED DESCRIPTION OF THE EMBODIMENTS

Figure 1A:
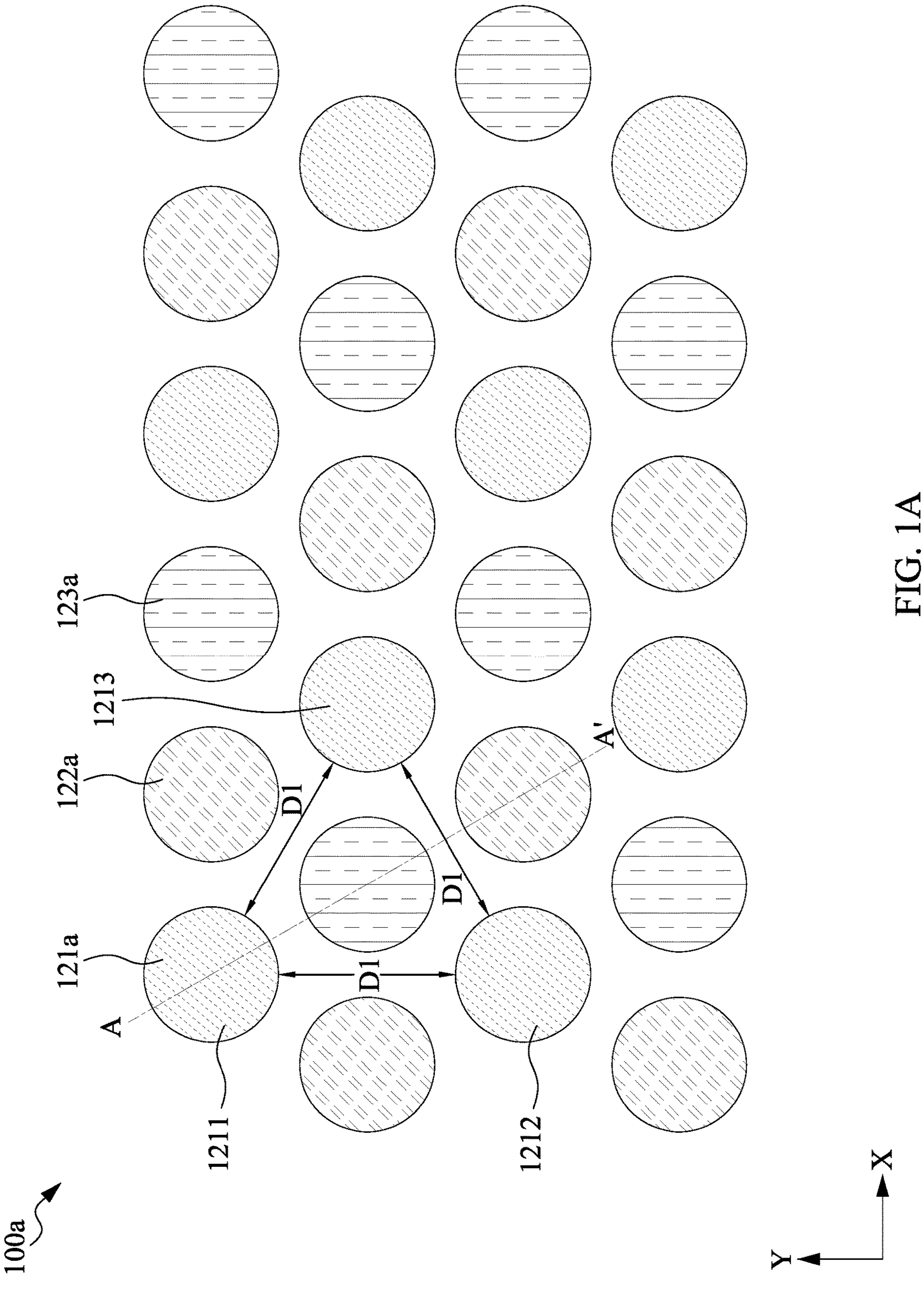
FIG. 1A is a top view of a display device according to some embodiments of the disclosure.

Different embodiments or examples are herein provided to illustrate how to implement various features of the disclosure. The specific examples of components and arrangement thereof are aimed at rendering the disclosure easy to understand. However, the examples are illustrative rather than restrictive of the disclosure. For instance, an embodiment of "forming a first feature on or above a second feature," as described below, may include another embodiment of "forming first and second features in direct contact with each other," or include yet another embodiment of "forming another feature between the first and second features, thereby precluding direct contact between the first and second features." Furthermore, reference numerals and/or signs may repeat in different examples herein; the repetition simplifies and clarifies the embodiments rather than defines the relation between the embodiments and/or features disclosed therein.

Position-related expressions, such as "under," "lower than," "low," "higher than," and "high," are used herein to describe the relation between a component/feature and another component/feature in the accompanying drawings. The position-related expressions may also indicate any directions not depicted in the accompanying drawings, for example, directions in which apparatuses are used or operated. Alternatively, the apparatuses can be positioned (rotated by 90 degrees or the like) in place, and the position-related expressions are still applicable.

Although all the numerical value ranges and parameters widely disclosed in the disclosure are approximations, the numerical values are stated as precisely as possible in specific embodiments. However, intrinsically, every numerical value inevitably comes with some errors arising from a standard deviation associated with individual testing measurement. Moreover, the expression "approximately" used hereunder means being not 10%, 5%, 1%, or 0.5% greater or less than a given value or being not falling outside the upper or lower limit of a range by 10%, 5%, 1%, or 0.5%. Alternatively, the expression "approximately" used hereunder means falling within the standard error regarded by persons skilled in the art as acceptable to the mean. Understandably, except for operation-related or work-related examples, or unless otherwise specified, all numerical value ranges, quantity, values, and percentages (for example, descriptive of the amount of a material used, time period, temperature, operation conditions, quantitative proportion, and the like) used hereunder are defined by the expression "approximately" in all situations. Therefore, unless otherwise specified, all numerical values and parameters disclosed hereunder and in the claims are approximations and are subject to changes as needed. At the very least, the numerical values and parameters must be interpreted in accordance with the reported number of significant figures and a general carry system. In this regard, a numerical value range is expressed as starting from an endpoint and ending at another endpoint or as lying between two endpoints. Unless otherwise specified, every numerical value range includes endpoints.

FIG. 1A is a top view of a display device 100*a* according to some embodiments of the disclosure.

In some embodiments, the display device 100*a* comprises pixels 121*a*, 122*a* and 123*a*. The pixels 121*a*, 122*a* and 123*a* are aligned in a row direction (for example, X direction) repeatedly, consecutively, and alternately. In some embodiments, the pixels 121*a*, 122*a* and 123*a* in a first row shift relative to the pixels 121*a*, 122*a* and/or 123*a* in a second row in X direction, respectively. The pixels 121*a*, 122*a* and 123*a* in the first row are aligned with the pixels 121*a*, 122*a* and 123*a* in a third row in Y direction, respectively. In some embodiments, the pixel 121*a* is configured to emit light of a first color, the pixel 122*a* is configured to emit light of a second color, and the pixel 123*a* is configured to emit light of a third color. In some embodiments, the light of the first color comprises green light (for example, light with wavelength ranging from 500 nm to 580 nm), the light of the second color comprises red light (for example, light with wavelength ranging from 620 nm to 780 nm), and the light of the third color comprises blue light (for example, light with wavelength ranging from 400 nm to 500 nm).

In some embodiments, the profile of the pixel 121*a* is round in shape. In some embodiments, the profile of the pixel 122*a* is round in shape. In some embodiments, the profile of the pixel 123*a* is round in shape.

In some embodiments, the pixel 121*a* comprises pixel units 1211, 1212, 1213 located at a first row, third row and second row, respectively. In some embodiments, the distances between any two adjacent ones of the pixel units are substantially the same. In some embodiments, any two adjacent ones of the pixel units are located at adjacent rows, respectively. For example, the pixel unit 1211 and the pixel unit 1212 are separated by distance D1. The pixel unit 1212 and the pixel unit 1213 are separated by distance D1. The pixel unit 1211 and the pixel unit 1213 are separated by distance D1. In some embodiments, the distances between any two adjacent ones of the pixel units (not denoted with any reference numeral) of the pixel 122*a* are substantially the same. In some embodiments, the distances between any two adjacent ones of the pixel units (not denoted with any reference numeral) of the pixel 123*a* are substantially the same.

Figure 1B:
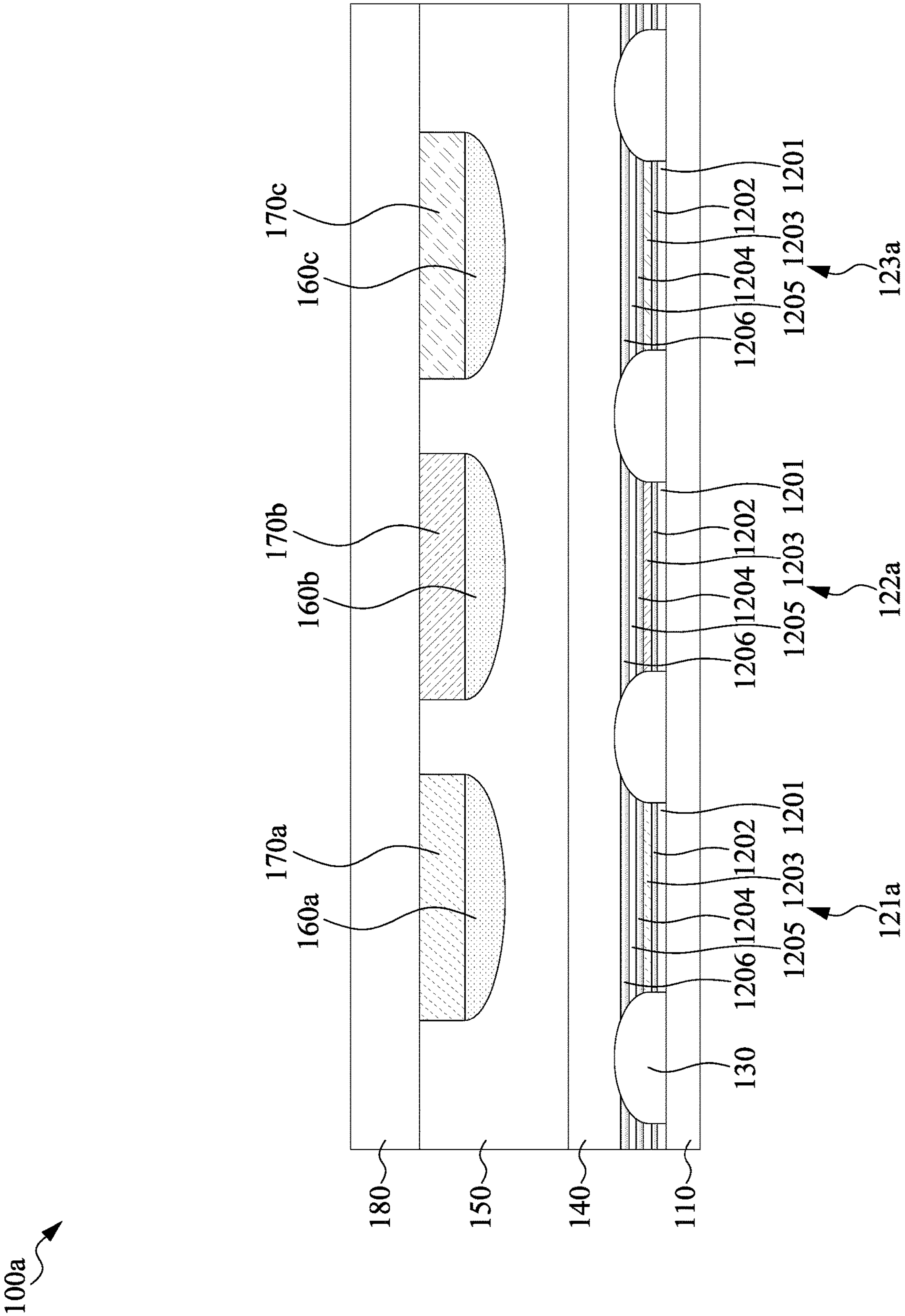
FIG. 1B is a cross-sectional view of the display device taken along line A-A' of FIG. 1A according to some embodiments of the disclosure.

FIG. 1B is a cross-sectional view of the display device 100*a* taken along line A-A' of FIG. 1A according to some embodiments of the disclosure.

In some embodiments, the display device 100*a* further comprises a substrate 110, a pixel definition layer 130, a flat layer 140, a filling layer 150, optical component layers 160*a*, 160*b*, 160*c*, filter layers 170*a*, 170*b*, 170*c*, and a cover panel 180.

In some embodiments, the substrate 110 comprises a base (not shown), a dielectric layer (not shown), and one or more circuits (not shown) disposed on or in the base. In some embodiments, the base is a transparent base, or at least part of the base is transparent. In some embodiments, the base is a non-flexible base, and the base is made of a material, such as glass, quartz, low-temperature poly-silicon (LTPS) or any other appropriate materials. In some embodiments, the base is a flexible base, and the base is made of a material, such as transparent epoxy resin, polyimide (PI), polyvinyl chloride (PVC), methyl methacrylate (MMA) or any other appropriate materials. The dielectric layer is disposed on the base as needed. In some embodiments, the dielectric layer is made of a material, such as silicon oxide, nitridosilicate, silicon oxynitride or any other appropriate materials.

In some embodiments, the circuits are complementary metal-oxide-semiconductor (CMOS) circuits or each comprise a plurality of transistors and a plurality of capacitors adjacent to the transistors, wherein the transistors and capacitors are formed on the dielectric layer. In some embodiments, the transistors are thin-film transistors (TFT). The transistors each comprise a source/drain region (comprising at least one source region and one drain region), a channel region between the source/drain region, a gate electrode disposed above the channel region, and a gate insulator between the channel region and the gate electrode. The channel regions of the transistors are made of semiconductor materials, such as, silicon or any other elements selected from group IV or III elements and group V elements.

In some embodiments, the substrate 110 comprises an interlayer dielectric structure and a first metallic layer. The interlayer dielectric structure is disposed on the circuits or transistors. The first metallic layer is electrically connected to the pixels 121*a*, 122*a* and/or 123*a*.

The pixels 121*a*, 122*a* and 123*a* are disposed on the substrate 110. In some embodiments, the pixels 121*a*, 122*a* and 123*a* are each an organic light-emitting diode (LED), a micro LED or mini LED, a quantum dot LED (QLED) or any other appropriate pixel.

In some embodiments, the pixels 121*a*, 122*a* and 123*a* each comprise an electrode 1201, a carrier injection layer 1202, a carrier transmission layer 1203, an emissive layer (EML) 1204, a carrier transmission layer 1205, and an electrode 1206.

The electrode 1201 is disposed on the surface of the substrate 110. The electrodes 1201 are each configured to have: one side connected to a circuit embedded in or electrically connected to the substrate 110, and the other side in contact with the carrier injection layer 1202. The electrode 1201 is made of a metallic material, for example, Ag and Mg. In some embodiments, the electrode 1201 is made of indium tin oxide (ITO), indium zinc oxide (IZO) or any other appropriate materials.

The carrier injection layer 1202 is disposed on the electrode 1201. In some embodiments, the carrier injection layer 1202 is for use in hole injection. In some embodiments, the carrier injection layer 1202 is for use in electron injection. In some embodiments, the carrier injection layer 1202 is in contact with the pixel definition layer 130. In some embodiments, the carrier injection layer 1202 is made of an organic compound. In some embodiments, the carrier injection layer 1202 is a composite structure.

The carrier transmission layer 1203 is disposed on the carrier injection layer 1202. In some embodiments, the carrier transmission layer 1203 is a hole transportation layer (HTL). In some embodiments, the carrier transmission layer 1203 is an electron transportation layer (ETL). In some embodiments, the carrier transmission layer 1203 is in contact with the pixel definition layer 130. In some embodiments, the carrier transmission layer 1203 is made of an organic compound. In some embodiments, the carrier transmission layer 1203 is characterized by unidirectional (for example, in the direction from the electrode 1201 to the electrode 1206) transmission of electrons or holes. In some embodiments, the carrier transmission layer 1203 is a composite structure.

The emissive layer 1204 is disposed on the carrier transmission layer 1203. The emissive layer 1204 covers the carrier transmission layer 1203 completely. In some embodiments, the emissive layers 1204 of the pixel 121*a*, pixel 122*a* and pixel 123*a* are made of different materials to emit light beams of different wavelengths, respectively. For example, the emissive layer 1204 of the pixel 122*a* is configured to emit light of a first color, the emissive layer 1204 of the pixel 121*a* is configured to emit light of a second color, and the emissive layer 1204 of the pixel 123*a* is configured to emit light of a third color.

The carrier transmission layer 1205 is disposed on the emissive layer 1204. In some embodiments, the carrier transmission layer 1205 is an electron transportation layer. In some embodiments, the carrier transmission layer 1205 is a hole transportation layer. In some embodiments, the carrier transmission layer 1205 and the carrier transmission layer 1203 are arranged to be in opposite valence states. In some embodiments, the carrier transmission layer 1205 is a composite structure.

The electrode 1206 is disposed on the carrier transmission layer 1205. The electrode 1206 is made of a metallic material, for example, Ag and Mg. In some embodiments, the electrode 1206 is made of indium tin oxide (ITO), indium zinc oxide (IZO) or any other appropriate materials.

The pixel definition layer 130 is disposed between two pixels (for example, the pixels 121*a*, 122*a* and 123*a*). The opening of the pixel definition layer 130 is used to define the light emission areas and/or profiles of the aforesaid pixels. In some embodiments, the pixel definition layer 130 is made of a light absorbing material whose absorbance is greater than 85%, for example, 85%, 88%, 90%, 93%, 95%, 97%, 98% or 99%. In some embodiments, the pixel definition layer 130 is made of a light penetrable material whose transmittance is greater than 85%, for example, 85%, 88%, 90%, 93%, 95%, 97%, 98% or 99%. The pixel definition layer 130 is made of a dielectric material.

In some embodiments, the profile of the opening of the pixel definition layer 130 is round in shape. In some embodiments, the opening of the pixel definition layer 130 is adapted to contain the electrode 1201, the carrier injection layer 1202, the carrier transmission layer 1203, the emissive layer 1204, the carrier transmission layer 1205 and/or the electrode 1206.

In some embodiments, the profiles of the electrode 1201, the carrier injection layer 1202, the carrier transmission layer 1203, the emissive layer 1204, the carrier transmission layer 1205 and/or the electrode 1206 are round in shape.

The flat layer 140 is disposed on the substrate 110. The flat layer 140 covers the pixel 121*a*, pixel 122*a*, pixel 123*a* and pixel definition layer 130 and provides a flat upper surface. The flat layer 140 is made of an oxide, a nitride or any other dielectric materials.

The filling layer 150 is disposed on the flat layer 140. The filling layer 150 is made of a substantially transparent material, for example, resin or any other appropriate materials, and comprises any filler. The transmittance of the filling layer 150 is greater than 85%, for example, 85%, 88%, 90%, 93%, 95%, 97%, 98% or 99%.

In some embodiments, the optical component layers 160*a*, 160*b* and 160*c* are disposed in the filling layer 150. The optical component layer 160*a* is not only disposed on the pixel 121*a* but also aligned with the pixel 121*a* in the longitudinal direction. The optical component layer 160*b* is not only disposed on the pixel 122*a* but also aligned with the pixel 122*a* in the longitudinal direction. The optical component layer 160*c* is not only disposed on the pixel 123*a* but also aligned with the pixel 123*a* in the longitudinal direction. In some embodiments, the optical component layers 160*a*, 160*b* and 160*c* are adapted to alter the light paths of the light beams emitted from the pixels. In some embodiments, the optical component layers 160*a*, 160*b* and 160*c* each comprise a lens or any other appropriate components. In some embodiments, the optical component layers 160*a*, 160*b* and 160*c* have profiles that protrude toward the substrate 110. In some embodiments, in a top view, the optical component layer 160*a*, optical component layer 160*b* and/or optical component layer 160*c* each has substantially the same profile as the pixel 121*a*, 122*a* and/or 123*a*. In some embodiments, in a top view, the profiles/profile of the optical component layer 160*a*, optical component layer 160*b* and/or optical component layer 160*c* are/is round in shape.

As shown in FIG. 1B, the filter layer 170*a* is not only disposed on the optical component layer 160*a* but also aligned with the optical component layer 160*a* in the longitudinal direction. The filter layer 170*b* is not only disposed on the optical component layer 160*b* but also aligned with the optical component layer 160*b* in the longitudinal direction. The filter layer 170*c* is not only disposed on the optical component layer 160*c* but also aligned with the optical component layer 160*c* in the longitudinal direction. The filter layers 170*a*, 170*b* and 170*c* are penetrable by light beams of different wavelengths, respectively. For example, the filter layer 170*a* is penetrable or transmissive by green light (for example, light with wavelength ranging from 500 nm to 580 nm), the filter layer 170*b* is penetrable or transmissive by red light (for example, light with wavelength ranging from 620 nm to 780 nm), and the filter layer 170*c* is penetrable or transmissive by blue light (for example, light with wavelength ranging from 400 nm to 500 nm). In some embodiments, in a top view, the filter layers 170*a*, 170*b* and/or 170*c* each have substantially the same profile as the pixels 121*a*, 122*a* and/or 123*a*. In some embodiments, the filter layers 170*a*, 170*b* and 170*c* can be dispensed with.

The cover panel 180 is disposed on the filter layers 170*a*, 170*b* and 170*c*. In some embodiments, the cover panel 180 comprises a substantially transparent component, for example, glass or any other appropriate components.

In an embodiment of the disclosure, the profile of the opening of the pixel definition layer 130 and the profiles of the pixels 121*a*, 122*a* and 123*a* are round in shape. It is desirable to define the opening of the pixel definition layer 130. When the profile of the opening of the pixel definition layer 130 meets one of the criteria as follows: (1) the ratio of the length of a long axis to the length of a short axis is greater than or equal to 1 but less than 1.25; and (2) the ratio of the length of the longest side to the length of the shortest side is greater than or equal to 1 but less than 1.25, the tension of the pixel definition layer 130 is kept within a relatively appropriate range conducive to the reduction in the difference (caused by an error of a photolithography process) between a resultant profile of the pixel definition layer 130 and the expected profile thereof, so as to ensure that the pixels 121*a*, 122*a* and 123*a* have the same size.

Figure 2A:
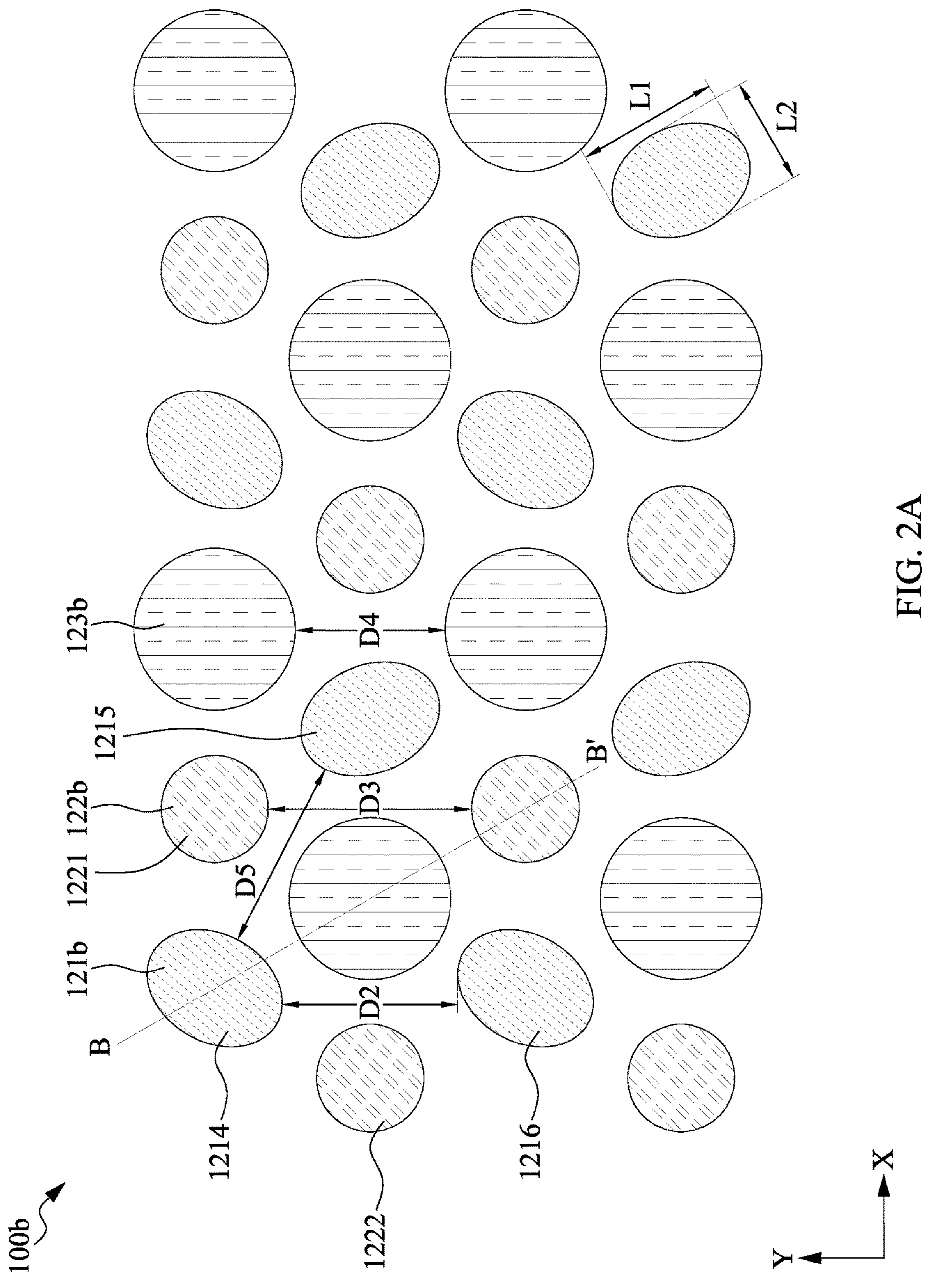
FIG. 2A is a top view of a display device according to some embodiments of the disclosure.

FIG. 2A is a top view of a display device 100*b* according to some embodiments of the disclosure. The display device 100*b* is distinguished from the display device 100*a* by the technical features described below.

In some embodiments, the display device 100*b* comprises pixels 121*b*, 122*b* and 123*b*. In some embodiments, the pixels 121*b*, 122*b* and 123*b* have different profiles. In some embodiments, the pixels 121*b*, 122*b* and 123*b* have different sizes. In some embodiments, the pixels 121*b*, 122*b* and 123*b* have different surface areas In some embodiments, the pixel 121*b* has an elliptical profile. In some embodiments, the ratio of the length of long axis L1 of the pixel 121*b* to the length of short axis L2 of the pixel 121*b* is greater than or equal to 1 but less than 1.25, for example, is equal to 1, 1.05, 1.1, 1.5, 1.2, 1.21, 1.22, 1.23, 1.24 or 1.245. The pixel 121*b* has a pixel unit 1214, pixel unit 1215 and pixel unit 1216. The pixel unit 1214 is located at a first row. The pixel unit 1215 is located at a second row. The pixel unit 1216 is located at a third row. In some embodiments, the profile of the pixel unit 1214 is different from the profile of the pixel unit 1215. In some embodiments, the profile of the pixel unit 1214 is the same as the profile of the pixel unit 1216. In some embodiments, basically, the profile of the pixel unit 1214 and the profile of the pixel unit 1215 may be minor images to each other. For example, after the pixel unit 1214 has been rotated about Y-axis by 180 degrees, the profile of the pixel unit 1214 becomes identical to the profile of the pixel unit 1215. The pixel 122*b* has a pixel 1221 and a pixel 1222. The pixel 1221 is located at a first row. The pixel 1222 is located at a second row. In some embodiments, the profile of the pixel 1221 is identical to the profile of the pixel 1222.

The pixel unit 1214 and the pixel unit 1216 are separated by distance D2. Two adjacent pixels 122*b* are separated by distance D3. Two adjacent pixels 123*b* are separated by distance D4. The pixel unit 1214 and the pixel unit 1215 are separated by distance D5. In some embodiments, distance D2 is not equal to distance D3. In some embodiments, distance D3 is not equal to distance D4. In some embodiments, distance D2 is not equal to distance D4. In some embodiments, distance D2 is substantially equal to distance D5.

Figure 2B:
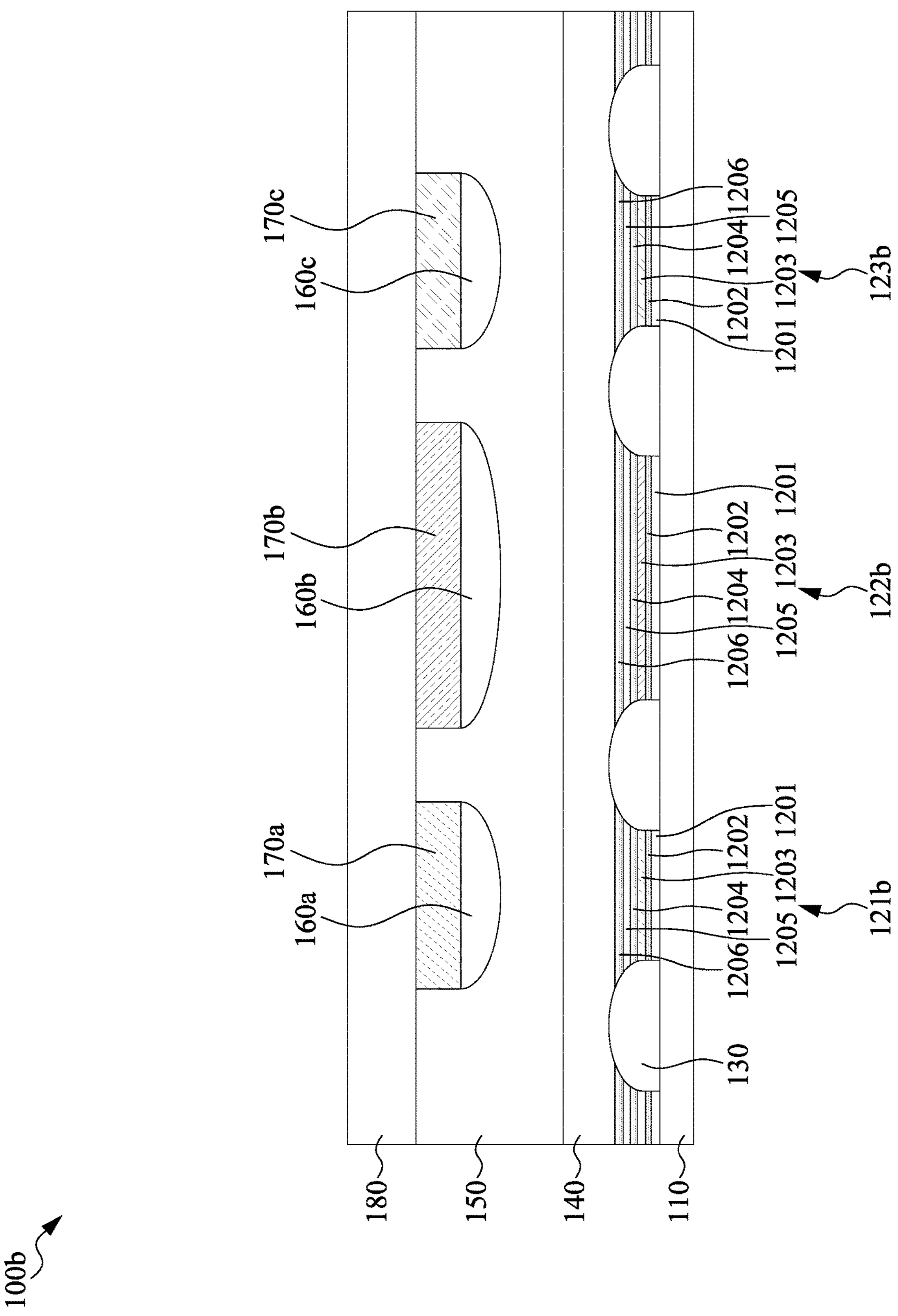
FIG. 2B is a cross-sectional view of the display device taken along line B-B' of FIG. 2A according to some embodiments of the disclosure.

FIG. 2B is a cross-sectional view of the display device taken along line B-B' of FIG. 2A according to some embodiments of the disclosure.

In some embodiments, in a top view, the opening of the pixel definition layer 130 is defined to have an elliptical and/or round profile. Regarding the opening of the pixel definition layer 130, the ratio of the length of its long axis and the length of its short axis is greater than or equal to 1 but less than 1.25, for example, is equal to 1, 1.05, 1.1, 1.5, 1.2, 1.21, 1.22, 1.23, 1.24 or 1.245.

The optical component layers 160*a*, 160*b* and 160*c* have the same profile as the pixels 121*b*, 122*b* and 123*b*, respectively. The optical component layers 160*a*, 160*b* and 160*c* have the same size as the pixels 121*b*, 122*b* and 123*b*, respectively. In some embodiments, the optical component layers 160*a*, 160*b* and 160*c* have different profiles. In some embodiments, the optical component layers 160*a*, 160*b* and 160*c* have different sizes. In some embodiments, in a top view, the ratio of the length of the long axis of the optical component layer 160*a* to the length of the short axis of the optical component layer 160*a* is greater than or equal to 1 but less than 1.25, for example, is equal to 1, 1.05, 1.1, 1.5, 1.2, 1.21, 1.22, 1.23, 1.24 or 1.245.

The filter layers 170*a*, 170*b* and 170*c* have the same profile as the pixels 121*b*, 122*b* and 123*b*, respectively. The filter layers 170*a*, 170*b* and 170*c* have the same size as the pixels 121*b*, 122*b* and 123*b*, respectively. In some embodiments, the filter layers 170*a*, 170*b* and 170*c* have different profiles. In some embodiments, the filter layers 170*a*, 170*b* and 170*c* have different sizes. In some embodiments, in a top view, the ratio of the length of the long axis of the filter layer 170*a* to the length of the short axis of the filter layer 170*a* is greater than or equal to 1 but less than 1.25, for example, is equal to 1, 1.05, 1.1, 1.5, 1.2, 1.21, 1.22, 1.23, 1.24 or 1.245.

In this embodiment, the pixel 121*a* has an elliptical profile, and the tension of the pixel definition layer 130 is kept within a relatively appropriate range conducive to the reduction in the difference (caused by an error of a photolithography process) between a resultant profile of the pixel definition layer 130 and the expected profile thereof when the ratio of the length of the long axis of the pixel 121*a* to the length of the short axis of the pixel 121*a* is greater than or equal to 1 but less than 1.25.

Figure 3:
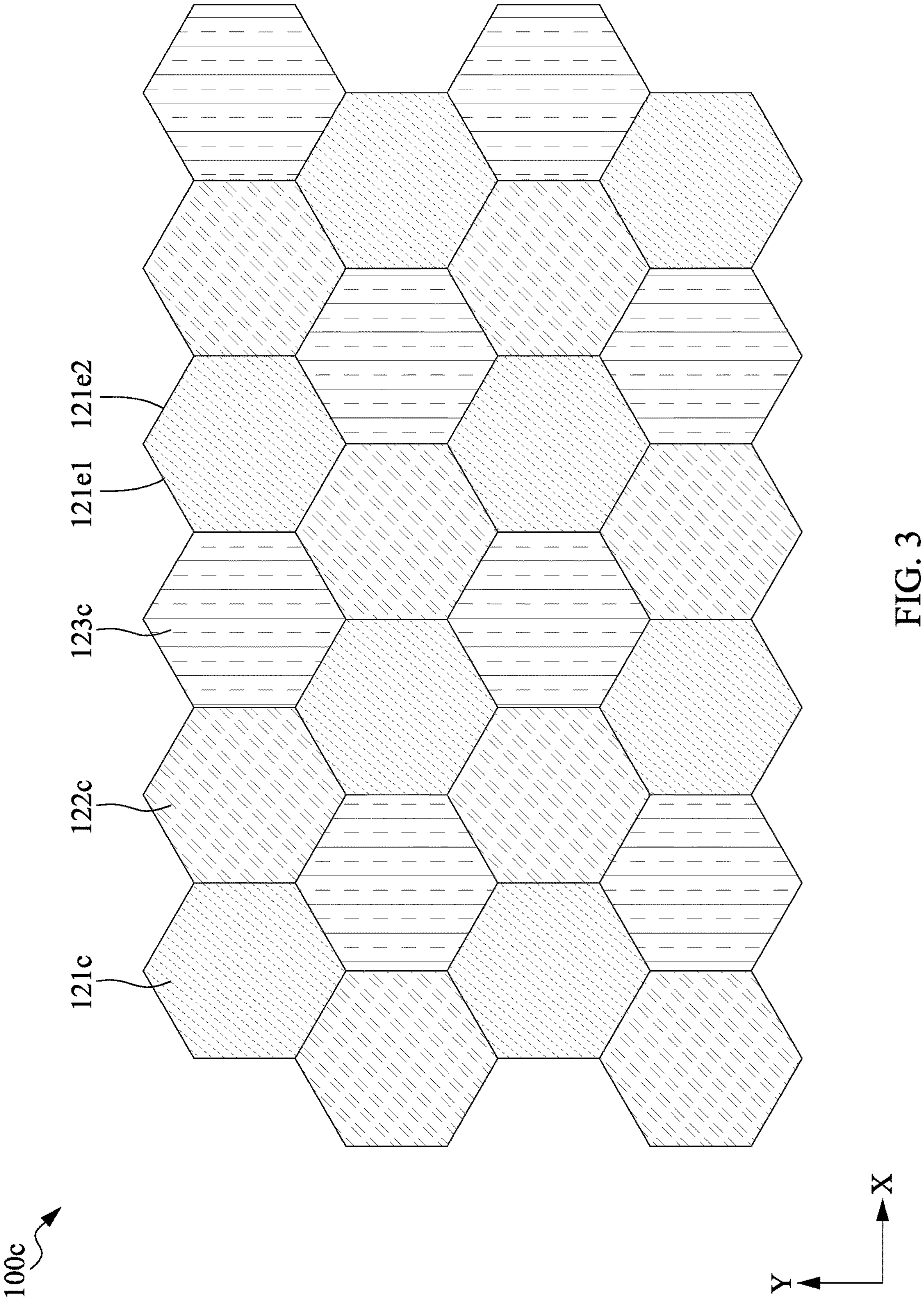
FIG. 3 is a top view of a display device according to some embodiments of the disclosure.

FIG. 3 is a top view of a display device 100*c* according to some embodiments of the disclosure. The display device 100*c* is distinguished from the display device 100*a* by the technical features described below.

In some embodiments, the display device 100*c* comprises pixels 121*c*, 122*c* and 123*c*. In some embodiments, the pixels 121*c*, 122*c* and 123*c* have polygonal profiles. In some embodiments, the pixels 121*c*, 122*c* and 123*c* have regular hexagonal profiles. In other embodiments, each profile of the pixels 121*c*, 122*c* and 123*c* is one of a pentagon, octagon, decagon and dodecagon. In some embodiments, the pixels 121*c*, 122*c* and 123*c* each have a side 122*e*1 and a side 122*e*2. In some embodiments, the side 122*e*1 and the side 122*e*2 are equal in length. In some embodiments, the side 122*e*1 and the side 122*e*2 are different in length. In some embodiments, the side 122*e*1 is a long side (or the longest side), whereas the side 122*e*2 is a short side (or the shortest side), and the ratio of the length of the side 122*e*1 to the length of the side 122*e*2 is greater than or equal to 1 but less than 1.25, for example, is equal to 1, 1.05, 1.1, 1.5, 1.2, 1.21, 1.22, 1.23, 1.24 or 1.245.

In this embodiment, the pixels 121*c*, 122*c* and 123*c* have polygonal profiles, and the tension of the pixel definition layer 130 is kept within a relatively appropriate range conducive to the reduction in the difference (caused by an error of a photolithography process) between a resultant profile of the pixel definition layer 130 and the expected profile thereof when the ratio of the length of their long side to the length of their short side is greater than or equal to 1 but less than 1.25.

FIGS. 4A, 4B, 4C, 4D and 4E are schematic views of the display device in different stages of a manufacturing process carried out with a method according to some embodiments of the disclosure.

Figure 4A:
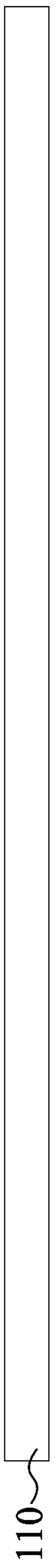
FIGS. 4A, 4B, 4C, 4D and 4E are schematic views of the display device in different stages of a manufacturing process carried out with a method according to some embodiments of the disclosure.

Referring to FIG. 4A, the method involves providing the substrate 110.

Figure 4B:
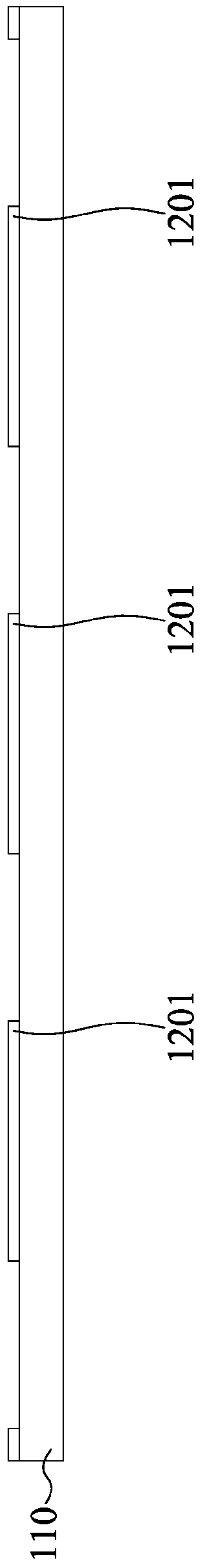

Referring to FIG. 4B, the method involves forming a plurality of electrodes 1201 on the substrate 110. The electrodes 1201 are formed on the substrate 110 by vapor deposition, sputtering, atomic layer deposition (ALD), evaporation, coating or jetting and patterned by photolithography technology and etching technology.

Figure 4C:
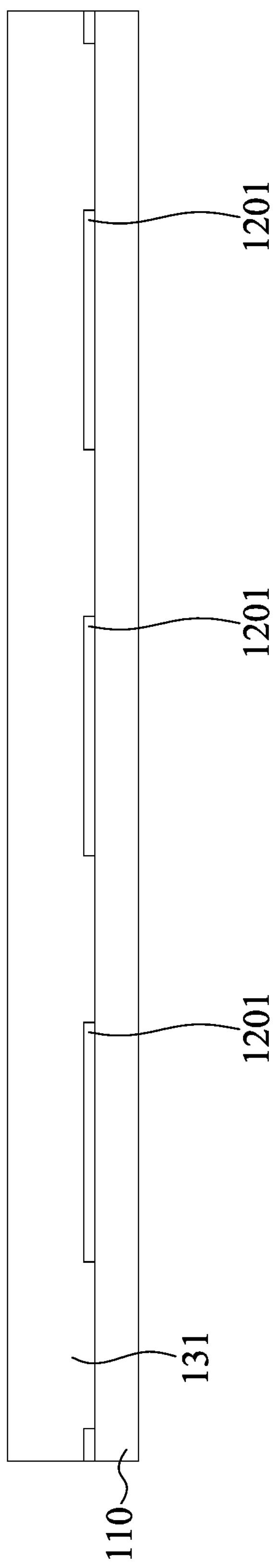

Referring to FIG. 4C, the method involves forming a dielectric layer 131 to cover the electrode 1201 and the substrate 110.

Figure 4D:
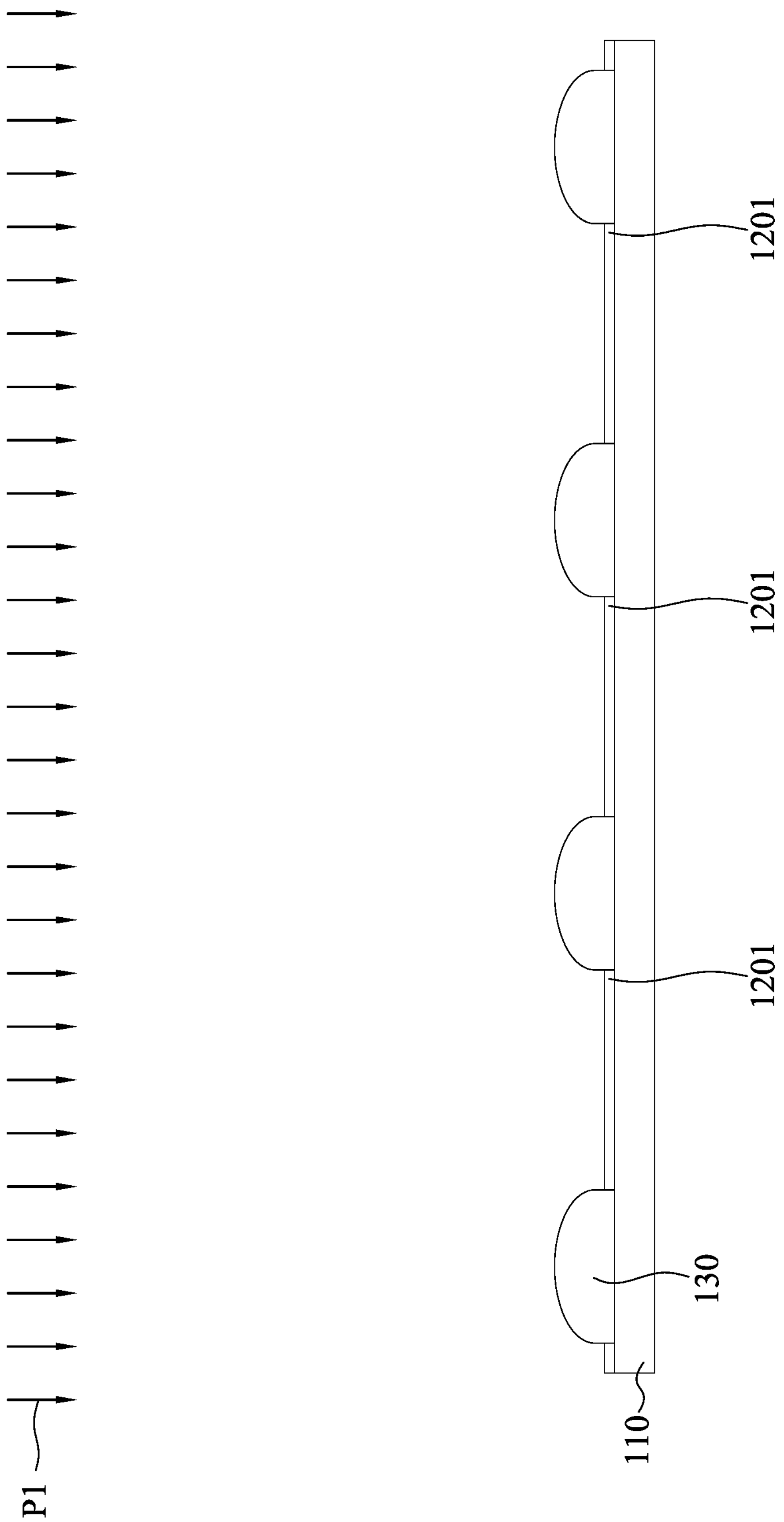

Referring to FIG. 4D, the method involves performing a patterning process P1 to pattern the dielectric layer 131, with the patterning process comprising a photolithography process and an etching process. The photolithography process includes forming a photoresist (not shown) on the dielectric layer 131, exposing the dielectric layer 131 with a reticle, developing a pattern for defining the photoresist, performing an etching process, and removing a portion of the dielectric layer 131, so as to form a pixel definition layer 130. In some embodiments, the profile of the opening of the pixel definition layer 130 meets one of the criteria as follows: (1) the ratio of the length of a long axis to the length of a short axis is greater than or equal to 1 but less than 1.25; and (2) the ratio of the length of the longest side to the length of the shortest side is greater than or equal to 1 but less than 1.25.

Figure 4E:
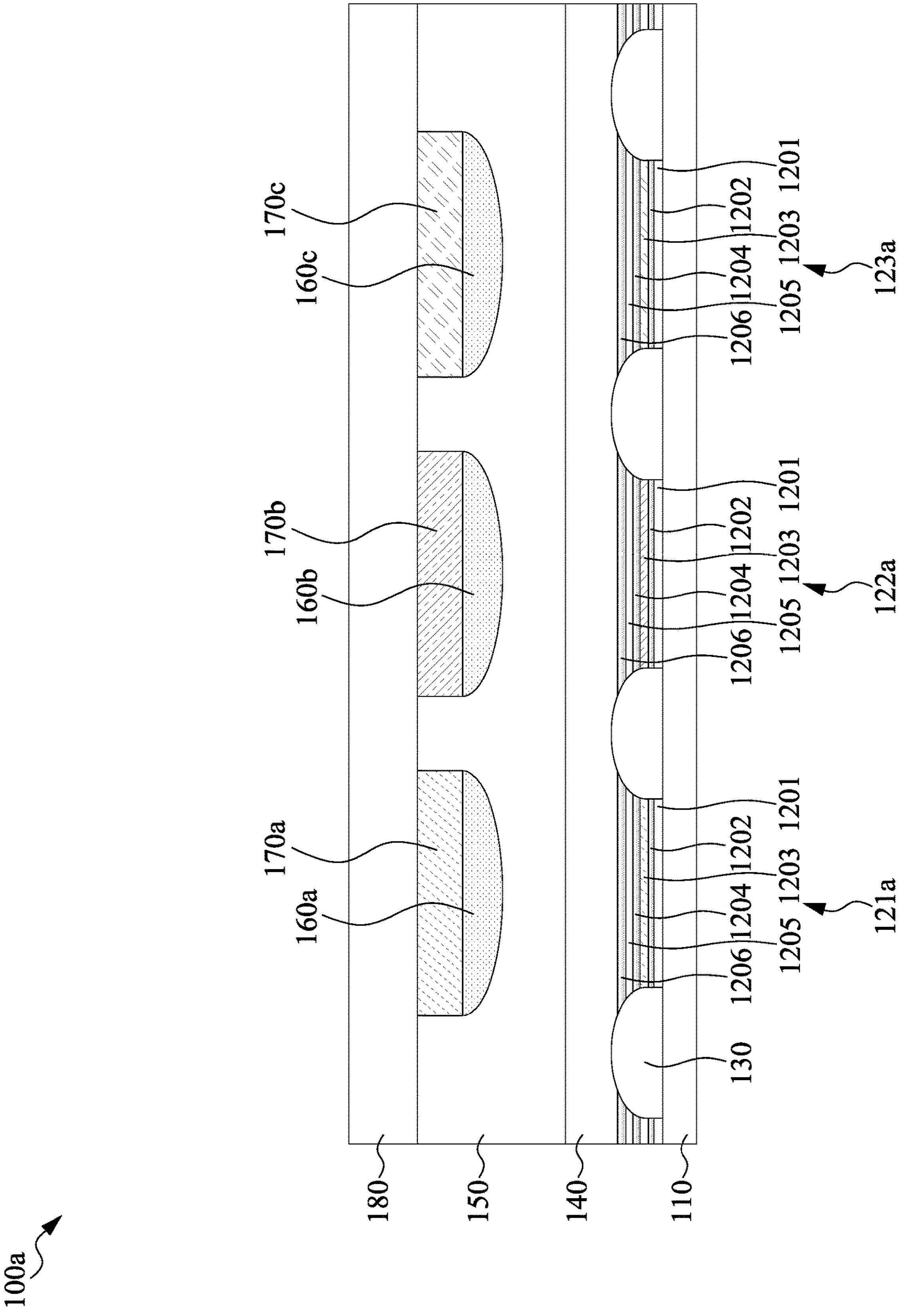

Referring to FIG. 4E, the method involves forming the carrier injection layer 1202, carrier transmission layer 1203, emissive layer 1204, carrier transmission layer 1205, electrode 1206, flat layer 140, filling layer 150, optical component layers 160*a*, 160*b*, 160*c*, filter layers 170*a*, 170*b*, 170*c* and cover panel 180 to obtain the display device 100*a* shown in FIG. 1B.

In a comparison embodiment, regarding the profile of the opening of the pixel definition layer, the ratio of the length of the longest side to the length of the shortest side (or the ratio of the length of a long axis to the length of a short axis) is greater than or equal to 1.25 (for example, in the case of a rectangular profile). During an exposure process performed on the dielectric layer, a large error of the process is likely to cause deformation of the profile of the pixel definition layer because of a relatively high tension of the dielectric layer. In this embodiment of the disclosure, when the profile of the opening of the pixel definition layer 130 meets one of the criteria as follows: (1) the ratio of the length of a long axis to the length of a short axis is greater than or equal to 1 but less than 1.25; and (2) the ratio of the length of the longest side to the length of the shortest side is greater than or equal to 1 but less than 1.25, the deformation of the profile of the dielectric layer 131 which is otherwise caused by an error of the exposure process performed on the dielectric layer 131 is unlikely to occur.

The features of some embodiments of the disclosure are disclosed above to enable persons skilled in the art to gain insight into the disclosure. Persons skilled in the art understand that the disclosure can be used as a basis easily to design or modify other processes and structures and thereby achieve the same objectives and/or advantages as disclosed in the embodiments of the disclosure. Persons skilled in the art also understand that the aforesaid equivalent framework does not depart from the spirit and scope of the disclosure. Furthermore, persons skilled in the art may make various changes, replacements and substitutions to the embodiments of the disclosure without departing from the spirit and scope of the disclosure.

Moreover, the scope of the disclosure is not restricted to the specific embodiments of the processes, machines, manufacturing, composition of matter, means, methods and steps herein. The disclosure enables persons skilled in the art to understand that it is feasible to apply, in accordance with the disclosure, existing or potential processes, machines, manufacturing, composition of matter, means, methods, or steps which have the same functions or substantially the same outcome as disclosed in the embodiments of the disclosure. Therefore, the processes, machines, manufacturing, composition of matter, means, methods, or steps fall within the scope of the claims of the disclosure.

What is claimed is:

1. A display device, comprising:

a first pixel adapted to emit light of a first color, wherein a profile of the first pixel is elliptical; and a second pixel adapted to emit light of a second color, the second color being different from the first color, wherein a profile of the second pixel is round;

wherein the profile of the first pixel meets that a ratio of a length of a long axis to a length of a short axis is greater than 1 but less than 1.25, and wherein the first pixel has a first pixel unit, a second pixel unit, and a third pixel unit, the first pixel unit is aligned with the third pixel unit along a first direction and misaligned with the second pixel unit along the first direction and a second direction substantially orthogonal to the first direction, an extending direction of a long axis of the first pixel unit is nonparallel to the first direction and the second direction, and the extending direction of the long axis of the first pixel unit is nonparallel to an extending direction of a long axis of the second pixel unit and is parallel to an extending direction of a long axis of the third pixel unit.

2. The display device of claim 1, wherein the profile of the first pixel is different from the profile of the second pixel.

3. The display device of claim 1, wherein a profile of the first pixel unit is different from a profile of the second pixel unit.

4. The display device of claim 3, wherein the first pixel unit is located at a first row, and the second pixel unit is located at a second row adjacent to the first row.

5. The display device of claim 4, wherein the third pixel unit is located at a third row adjacent to the second row, and a first distance between the first pixel unit and the third pixel unit is equal to a second distance between the first pixel unit and the second pixel unit.

6. The display device of claim 5, wherein a profile of the third pixel unit is identical to a profile of the first pixel unit.

7. The display device of claim 4, wherein the second pixel has a fourth pixel unit located at the first row and a fifth pixel unit located at the second row, and a profile of the fourth pixel unit is identical to a profile of the fifth pixel unit.

8. The display device of claim 1, wherein a size of the first pixel is different from a size of the second pixel.

9. The display device of claim 1, further comprising:

a first filter layer disposed above the first pixel, wherein a profile of the first filter layer is elliptical and meets that a ratio of a length of a long axis to a length of a short axis is greater than 1 but less than 1.25.

10. The display device of claim 9, further comprising:

a second filter layer disposed above the second pixel, wherein a profile of the second filter layer is different from the profile of the first filter layer.

11. The display device of claim 1, further comprising:

a pixel definition layer adapted to define the profile of the first pixel, wherein a profile of an opening of the pixel definition layer is elliptical and meets that a ratio of the length of a long axis to a length of a short axis is greater than 1 but less than 1.25.

12. The display device of claim 1, wherein the first pixel comprises a plurality of pixel units, with a constant distance between any two adjacent ones of the pixel units.

13. A method of manufacturing a display device, comprising the steps of:

forming a first pixel adapted to emit light of a first color, wherein a profile of the first pixel is elliptical; and forming a second pixel adapted to emit light of a second color, the second color being different from the first color, wherein a profile of the second pixel is round, wherein the profile of the first pixel meets that a ratio of a length of a long axis to a length of a short axis is greater than 1 but less than 1.25, and wherein the first pixel has a first pixel unit, a second pixel unit, and a third pixel unit, the first pixel unit is aligned with the third pixel unit along a first direction and misaligned with the second pixel unit along the first direction and a second direction substantially orthogonal to the first direction, an extending direction of a long axis of the first pixel unit is nonparallel to the first direction and the second direction, and the extending direction of the long axis of the first pixel unit is nonparallel to an extending direction of a long axis of the second pixel unit and is parallel to an extending direction of a long axis of the third pixel unit.

14. The method of claim 13, further comprising the steps of:

providing a substrate;

forming a dielectric layer on the substrate; and patterning the dielectric layer to form a pixel definition layer adapted to define the profile of the first pixel and the profile of the second pixel, wherein a profile of an opening of the pixel definition layer is elliptical and meets that a ratio of a length of a long axis to a length of a short axis is greater than 1 but less than 1.25.

15. The method of claim 13, further comprising the step of:

forming a first filter layer above the first pixel, wherein a profile of the first filter layer is elliptical and meets that a ratio of a length of a long axis to a length of a short axis is greater than or equal 1 but less than 1.25.

16. The method of claim 15, further comprising the step of:

forming a second filter layer above the second pixel, wherein a profile of the second filter layer is different from the profile of the first filter layer.

17. The method of claim 13, wherein the profile of the first pixel is different from the profile of the second pixel.

18. The method of claim 13, wherein a profile of the first pixel unit is different from a profile of the second pixel unit.

19. The method of claim 18, wherein the first pixel unit is located at a first row, and the second pixel unit is located at a second row adjacent to the first row.

20. The method of claim 13, wherein a size of the first pixel is different from a size of the second pixel.

* * * * *